United States Patent [19]
Dent

[11] Patent Number: 6,133,788
[45] Date of Patent: Oct. 17, 2000

[54] HYBRID CHIREIX/DOHERTY AMPLIFIERS AND METHODS

[75] Inventor: Paul Wilkinson Dent, Pittsboro, N.C.

[73] Assignee: Ericsson Inc., Research Triangle Park, N.C.

[21] Appl. No.: 09/054,063

[22] Filed: Apr. 2, 1998

[51] Int. Cl.$^7$ .................................................. H03F 3/68
[52] U.S. Cl. ...................................... 330/124 R; 330/295
[58] Field of Search ............................ 330/124 R, 295, 330/165; 332/144, 148, 103; 455/127, 129, 116; 375/279, 308, 295, 257

[56] References Cited

U.S. PATENT DOCUMENTS

| | | | |
|---|---|---|---|
| 2,210,028 | 8/1940 | Doherty | 179/171 |
| 3,777,275 | 12/1973 | Cox | 330/10 |
| 3,805,139 | 4/1974 | Hoffman, Jr. et al. | 321/5 |
| 3,906,401 | 9/1975 | Seidel | 332/18 |
| 3,909,742 | 9/1975 | Cox et al. | 330/84 |
| 3,927,379 | 12/1975 | Cox et al. | 330/10 |
| 4,090,147 | 5/1978 | Seidel | 330/10 |
| 4,178,557 | 12/1979 | Henry | 330/10 |
| 4,315,107 | 2/1982 | Ciesielka et al. | 179/16 F |
| 4,420,723 | 12/1983 | de Jager | 330/10 |
| 4,433,312 | 2/1984 | Kahn | 332/22 |
| 4,485,357 | 11/1984 | Voorman | 332/17 |
| 4,580,111 | 4/1986 | Swanson | 332/41 |
| 5,086,450 | 2/1992 | Kitagawa et al. | 379/40 |
| 5,420,541 | 5/1995 | Upton et al. | 330/286 |
| 5,453,717 | 9/1995 | Gerfault | 330/146 |
| 5,568,088 | 10/1996 | Dent et al. | 330/151 |
| 5,574,967 | 11/1996 | Dent et al. | 455/12.1 |
| 5,631,604 | 5/1997 | Dent et al. | 330/124 R |
| 5,638,024 | 6/1997 | Dent et al. | 330/84 |
| 5,734,565 | 3/1998 | Mueller et al. | 363/132 |
| 5,815,531 | 9/1998 | Dent | 375/298 |

FOREIGN PATENT DOCUMENTS

| | | |
|---|---|---|
| 0 471 346 A1 | 2/1992 | European Pat. Off. . |
| 0 725 478 A1 | 8/1996 | European Pat. Off. . |
| 2 267 402 | 12/1993 | United Kingdom . |

OTHER PUBLICATIONS

Chireix, "High Power Outphasing Modulation", Proceeding of the Institute of Radio Engineers, Vo. 23, No. 11, Nov. 1935.

International Search Report, PCT/US99/05681, Jul. 6, 1999.

*Primary Examiner*—Robert Pascal
*Assistant Examiner*—Henry Choe
*Attorney, Agent, or Firm*—Myers Bigel Sibley & Sajovec

[57] ABSTRACT

Two amplifiers that are driven using outphasing modulation are coupled to one another so that the amplifiers affect each other's effective load line. The two amplifiers can maintain efficiency over a wider dynamic range than in a conventional amplifier. Amplifiers according to the invention amplify an AC input signal of varying amplitude and varying phase using a DC power supply. A converter converts the AC input signal into a first signal having constant amplitude and a first phase angle and into a second signal having constant amplitude and a second phase angle. The first amplifier amplifies the first signal, and the second amplifier amplifies the second signal. A coupler couples the first and second amplifiers to one another and to a load impedance, such that voltages or currents in the first amplifier become linearly related to voltages or currents in the second amplifier. The coupler may include at least one transformer that serially couples the first and second amplifiers to one another and to the load impedance. The coupler may also include first and second quarter wave transmission lines that couple the first and second amplifiers to one another and to the load impedance. The amplifiers preferably use bilateral devices, such that current flows from the first and second amplifiers to the DC power supply during part of a signal cycle, and thereby returns energy to the DC power supply.

18 Claims, 7 Drawing Sheets

HYBRID CHIREIX/DOHERTY AMPLIFIERS AND METHODS

CROSS REFERENCE TO RELATED APPLICATION

This invention is related to application Ser. No. 09/054,060, filed Apr. 2, 1998, entitled "*Power Waveform Synthesis Using Bilateral Devices*" (Attorney Docket 8194-142), assigned to the assignee of the present invention, the disclosure of which is hereby incorporated herein by reference.

FIELD OF THE INVENTION

This invention relates to power amplifiers and amplifying methods, and more particularly to high-efficiency power amplifiers and related methods.

BACKGROUND OF THE INVENTION

Power amplifiers are widely used in communication systems, for example in radiotelephone base stations and radiotelephones. In radiotelephone communication systems, power amplifiers typically amplify high frequency signals for transmission.

A major consideration in the design of power amplifiers is the efficiency thereof. High efficiency is generally desirable so as to reduce the amount of power that is dissipated as heat. Moreover, in many applications, such as in satellites and portable radiotelephones, the amount of power that is available may be limited. An increase in efficiency in the power amplifier is therefore important, in order to allow an increase the operational time or capacity for the satellite or portable radiotelephone.

A conventional power amplifier such as a class-B amplifier generally only provides maximum efficiency at or near to its maximum saturated power output level. In order to accurately reproduce a signal of varying amplitude, the peak output signal level should be equal to or less than that maximum saturated power level. When the instantaneous signal output level is less than the peak, a conventional class-B power amplifier generally operates at less than maximum efficiency.

The efficiency generally reduces as the square root of the output power. This is because, using the class-B example, the output power reduces as the square of the output current but the power consumption from the battery or other DC supply reduces only proportional to the output current. Therefore, the efficiency, which is the ratio of output power to battery power, reduces proportional to the current, i.e., proportional to the square root of the output power.

Accordingly, a power amplifier that has 60% efficiency at a peak output of 2 watts will generally have no more than 42% efficiency at an output of 1 watt (3 dB reduced output). Moreover, when amplifying a signal of varying amplitude, a conventional amplifier may not produce an output signal amplitude proportional to the input signal amplitude, thereby causing nonlinear distortion and intermodulation.

With a varying output signal power $P(t)=A^2(t)$, the average efficiency can be estimated to be:

$$\text{Max efficiency} \times \frac{\text{average of } (P(t)/Pmax)}{\text{average of square root } (P(t)/Pmax)}$$

or $$\text{Max efficiency} \times \frac{\text{average of } (A(t)/Amax)^2}{\text{average } (A(t)/Amax)}.$$

Nonlinearities in conventional amplifiers can be reduced by various techniques, such as by an inverse predistortion of the input signal, or by feedback including Cartesian feedback in radio frequency power amplifiers for linearly amplifying signals with a bandwidth much less than the center frequency. Unfortunately, linearization generally does not alter the above efficiency formula, which in fact already assumes that the output amplitude can be made to faithfully follow the desired varying amplitude waveform. In effect, the average efficiency calculated above already assumes perfect linearization.

The loss of efficiency comes about because current I(t) is drawn from the battery at a constant voltage Vcc, but is supplied to the load at a varying voltage I(t)·RL which is less than Vcc. The voltage difference Vcc−I(t)·RL is lost across the output device (e.g. collector junction), causing power dissipation in the device.

In U.S. Pat. No. 2,210,028 to Doherty (August 1940), an arrangement of two vacuum tube power amplifiers coupled by a single quarter-wave line is described. The first amplifier is operated up to an output level of Pmax/4, at which it achieves maximum practical class-B efficiency. For powers above this level, the second amplifier is caused to contribute. The second amplifier affects the load impedance of the first amplifier one quarter wave away such that the first amplifier can increase its power up to Pmax/2, while the second amplifier also contributes up to Pmax/2, making Pmax in total, at which point both amplifiers are once more achieving maximum practical class-B efficiency. Thus, efficiency is preserved over a 6 dB range of output levels from Pmax/4 to Pmax. A semiconductor version of the Doherty amplifier is described in a more recent U.S. Pat. No. 5,420,541 entitled 'Microwave Doherty amplifier" to Upton et al.

In the prior art Doherty amplifier, the "normal" power amplifier amplifies a signal from 0 power to ¼ the peak power level, achieving maximum class-B efficiency at that power level. The peak power amplifier then begins to contribute to the output power and by reducing the effective load impedance seen by the "normal" power amplifier, enables it to generate a greater power output up to half the peak power level. The peak power amplifier also generates half the peak power level so that the two amplifiers jointly produce the desired peak power level. The "peak" power amplifier in this prior art is not operated in antiphase so as to detract from the output power level, and thereby increasing the effective load impedance seen by the "normal" power amplifier and allowing it to generate less power efficiently. Thus the "peak" power amplifier does not operate symmetrically as a "trough" power amplifier.

In Proc. IRE, Vol. 23 No. 11 (1935), pages 1370–1392, entitled "*High Power Outphasing Modulation*", Chireix describes producing a transmitter giving a modulated amplitude output signal by combining two constant output amplitude amplifiers with a variable phase difference so that their outputs can be varied in relative phase from additive to subtractive. The Chireix and Doherty techniques were not combined to obtain an amplifier of good linearity and high efficiency, as the Doherty amplifier relied on the two constituent amplifiers being co-phased while the Chireix amplifier relied upon them being out-of-phase. When two amplifiers are out-of-phase, they were in the prior art, preferably isolated from one another using a hybrid coupler or directional coupler to combine them. The directional coupler combines the two amplifier's output signals to produce a sum signal and a difference signal, the sum signal being used as the desired output and the difference signal being terminated in a dummy load. Since all the amplifier power ends up at either the sum or the difference port and is not reflected to either amplifier, the amplifiers are isolated from one another and do not affect each other's load line.

In U.S. Pat. Nos. 5,568,088, 5,574,967, 5,631,604, and 5,638,024 to applicant Dent, all entitled *"Waste Energy Control and Management in Power Amplifiers"*, various arrangements of coupled power amplifiers are disclosed in which a varying amplitude signal may be produced using constant amplitude power amplifiers. In one arrangement, two constant power amplifiers are driven with a relative phase shift as in Chireix such that their outputs add more or less constructively or destructively to produce a varying output. The amplifiers were coupled at their outputs using a hybrid coupler or directional coupler which forms both a sum signal and a difference signal. An improvement over the prior art described therein comprises recovering the normally wasted energy at the difference port using a rectifier circuit. The Doherty patent, the Chireix paper and the above referenced Dent patents are hereby incorporated by reference herein.

In applicant's 1964 graduate thesis project, an amplifier was built and reported in which the value of Vcc was selected to be either Vcc or 0.7 Vcc based on whether the desired output amplitude was greater or less than 0.7 Vcc. With a pure sine wave drive, this raised the peak efficiency from the theoretical value of $\pi/4$ (~78.5%) for a class-B amplifier to 85.6% for the new amplifier, termed class-BC. The efficiency at half maximum output power was now 78.5% instead of 55% for class-B.

The Vcc selection was effected by using a first pair of transistors connected to the 0.7 Vcc supply to supply load current when the output amplitude was less than 0.7 Vcc, and a second pair of transistors connected to the full Vcc supply for supplying the load current for amplitudes between 0.7 Vcc and Vcc. Diodes were used to protect the first pair of transistors by preventing reverse current flow when the output amplitude was driven above their supply voltage. The above arrangement worked well for audio frequencies where diodes turn on and off sufficiently fast, but may not be effective for microwave frequencies.

Also in the 1960's, many so called "class-D" or pulse-width modulation amplifiers were proposed and manufactured. Pulse-width modulation amplifiers switched the output devices on and off at a high frequency with a mark-space ratio proportional to the instantaneous desired signal waveform. A low-pass output filter smoothed the switching signal to reject the high switching frequency and to produce the mean of the varying mark-space ratio signal as the desired output signal waveform. A disadvantage of the class-D amplifier was the need to switch the output devices at a very much higher frequency than the desired signal to be amplified, which may not be practical when the desired signal is already a high frequency signal such as a microwave signal.

The above survey indicates that many techniques have been used in order to improve the efficiency of power amplifiers. However, notwithstanding these techniques, there continues to be a need for power amplifiers that can operate at high efficiencies at maximum output, and also at outputs that are below maximum output. Moreover, it is desirable for high efficiency power amplifiers to operate with high frequency signals, such as are used in wireless communication systems.

SUMMARY OF THE INVENTION

It is therefore an object of the invention to provide improved power amplifiers and amplifying methods.

It is another object of the present invention to provide power amplifiers and amplifying methods that are capable of high efficiency.

It is yet another object of the present invention to provide power amplifiers and amplifying methods that are capable of high efficiency at high frequencies.

It is still another object of the present invention to provide power amplifiers and amplifying methods that are capable of high efficiencies at levels below their maximum output power.

These and other objects are provided, according to the present invention, by coupling two amplifiers that are driven using Chireix outphasing modulation to one another, so that the amplifiers affect each other's effective load line. The two amplifiers can thereby maintain efficiency over a wider dynamic range than in a conventional Doherty amplifier.

More specifically, the invention provides apparatus that amplifies an AC input signal of varying amplitude and varying phase using a DC power supply. The apparatus includes a converter that converts the AC input signal into a first signal having constant amplitude and a first phase angle and into a second signal having constant amplitude and a second phase angle. A first amplifier amplifies the first signal, and a second amplifier amplifies the second signal. A coupler couples the first and second amplifiers to one another and to a load impedance, such that voltages or currents in the first amplifier become linearly related to voltages or currents in the second amplifier.

In one embodiment, described in detail below, the coupler comprises at least one transformer that serially couples the first and second amplifiers to one another and to the load impedance. In another embodiment, the coupler comprises first and second quarter wave transmission lines that couple the respective first and second amplifiers to one another and to the load impedance.

According to another aspect of the present invention, the first and second amplifiers are first and second bilateral amplifiers, such that current flows from the first and second amplifiers to the DC power supply during part of the signal cycle of the AC input signal, to thereby return energy to the DC power supply. Further increases in efficiency may thereby be obtained.

Accordingly, two coupled amplifiers driven using the outphasing modulation of Chireix can operate identically and can symmetrically affect each other's effective load line so as to efficiently generate both peak and trough power levels and maintain efficiency over a wider dynamic range than in a Doherty amplifier. When the two amplifiers that are not in phase affect each other's load line, current flows from the DC source to the load during part of the signal waveform cycle and flows to the source for another part of the cycle. The mean power consumption from the source can be reduced in the same ratio as the load power is reduced, thus maintaining efficiency. In the Chireix and Doherty disclosures, vacuum tubes of that era were not able to conduct in the reverse direction to return current to the source. In contrast, in the present invention, two amplifiers constructed using bilateral devices are driven by two, separate, preferably digitally synthesized waveforms and their outputs are combined, for example using transformers or two quarter wave lines connected to a harmonic short circuit. Using the invention, the linearity advantage of Chireix may be obtained together with an even greater efficiency improvement than Doherty's technique.

A first embodiment of a power amplifier according to the present invention, amplifies an AC input signal of varying amplitude and varying phase, to produce an amplified output signal voltage and an output current in a load impedance using a DC power supply. The power amplifier includes means for converting the AC input signal into a first signal having constant amplitude and a first phase angle and into a second signal having constant amplitude and a second phase angle.

The power amplifier also includes first means for amplifying the first signal, to produce a first output signal voltage of constant voltage amplitude. The first amplifying means includes bilateral amplifier devices that draw current from the DC power supply and supply current to the DC power supply. Second means for amplifying the second signal to produce a second output signal voltage of constant voltage amplitude is also included. The second amplifying means includes bilateral amplifier devices that draw current from the DC power supply and supply current to the DC power supply.

Means for serially coupling the first and second output signal voltages to the load impedance are also provided, such that the sum of the first and second output signal voltages produces the amplified output signal voltage across the load impedance, and produces the output current through the load impedance, and such that an amplifier current that is linearly related to the output current flows into the bilateral amplifier devices of both the first and second amplifying means. Preferably, during part of the signal cycle of the AC input signal, current flows from the first and second amplifying means to the DC power supply, to return energy to the DC power supply.

The converting means preferably comprises a quadrature oscillator and first and second quadrature modulators that are coupled to the quadrature oscillator, to produce the first and second signals, respectively. The converting means also preferably comprises a quadrature signal generator that is coupled to the first and second quadrature modulators, and that is responsive to the AC input signal to generate in-phase and quadrature signals. The quadrature signal generator may be a digital signal processor. Moreover, the converting means itself may be implemented using a data processor. Alternatively, the converting means may be implemented using a digital frequency synthesizing circuit including phase modulation capability, such as a direct digital frequency synthesizer.

In the above described embodiment, the serial coupling means preferably comprises at least one transformer. The at least one transformer comprises a first transformer including a first primary and a first secondary, and a second transformer including a second primary and a second secondary. The first output signal voltage is coupled to the first primary, and the second output signal voltage is coupled to the second primary. The first and second secondaries are serially connected across the load impedance.

In another embodiment of the present invention, means for coupling the first and second output signal voltages to the load impedance is provided, such that a voltage proportional to the sum of the first and second output signal voltages produces the amplified output signal voltage across the load impedance and produces the output current through the load impedance, and such that an amplifier current that is linearly related to the output current flows in the bilateral amplifier devices the first and second amplifying means.

In contrast with the coupling means described above, the coupling means of this embodiment need not serially couple the two amplifiers to the load impedance. Rather, the coupling means preferably comprises a first quarter wavelength transmission line that couples the first output signal voltage to the load impedance, and a second quarter wavelength transmission line that couples the second output signal voltage to the load impedance. The load impedance preferably includes an input node and the coupling means preferably comprises means for coupling the first output signal and the second output signal to the input node via the first and second quarter wavelength transmission lines. Thus, the same current may be forced to flow in both power amplifiers, scaled by any impedance differences between the quarter wavelength transmission lines.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Moreover, each embodiment described and illustrated herein includes its complementary conductivity type embodiment as well.

Figure 1:
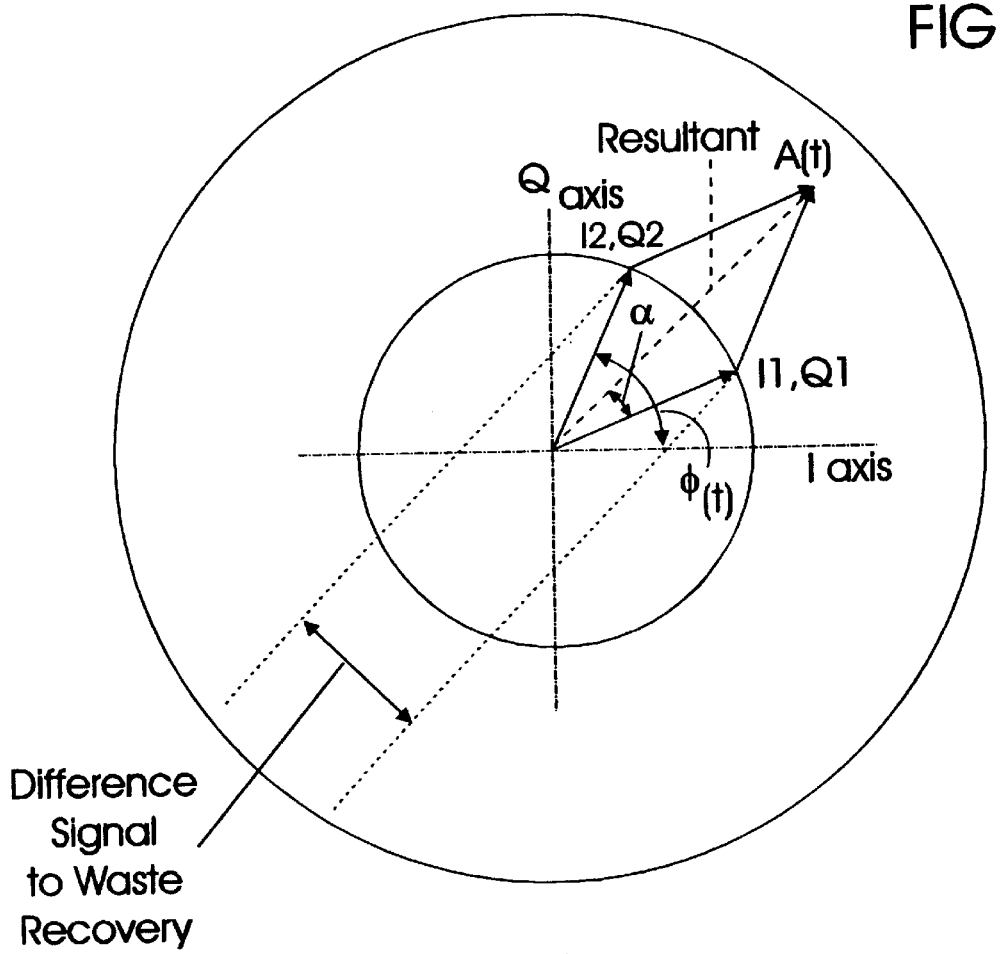
FIG. 1 graphically illustrates vector addition of two constant envelope signals.

FIG. 1 shows how a varying amplitude vector can be constructed by adding two constant amplitude vectors with correct relative phasing, as first proposed by Chireix in his 1935 paper. The inner circle indicates maximum amplitude for one power amplifier, and the outer circle indicates maximum amplitude for two equal power amplifiers. As shown, the desired amplitude is A(t) and the desired phase is $\phi(t)$. This may be obtained using first in-phase and quadrature signals I1 and Q1 and second in-phase and quadrature signals I2 and Q2, where I1=COS ($\phi-\alpha$), Q1=SIN ($\phi-\alpha$), I2=COS ($\phi+\alpha$), and Q2=($\phi+\alpha$), where $\alpha$=arcos (A/2).

Figure 2:
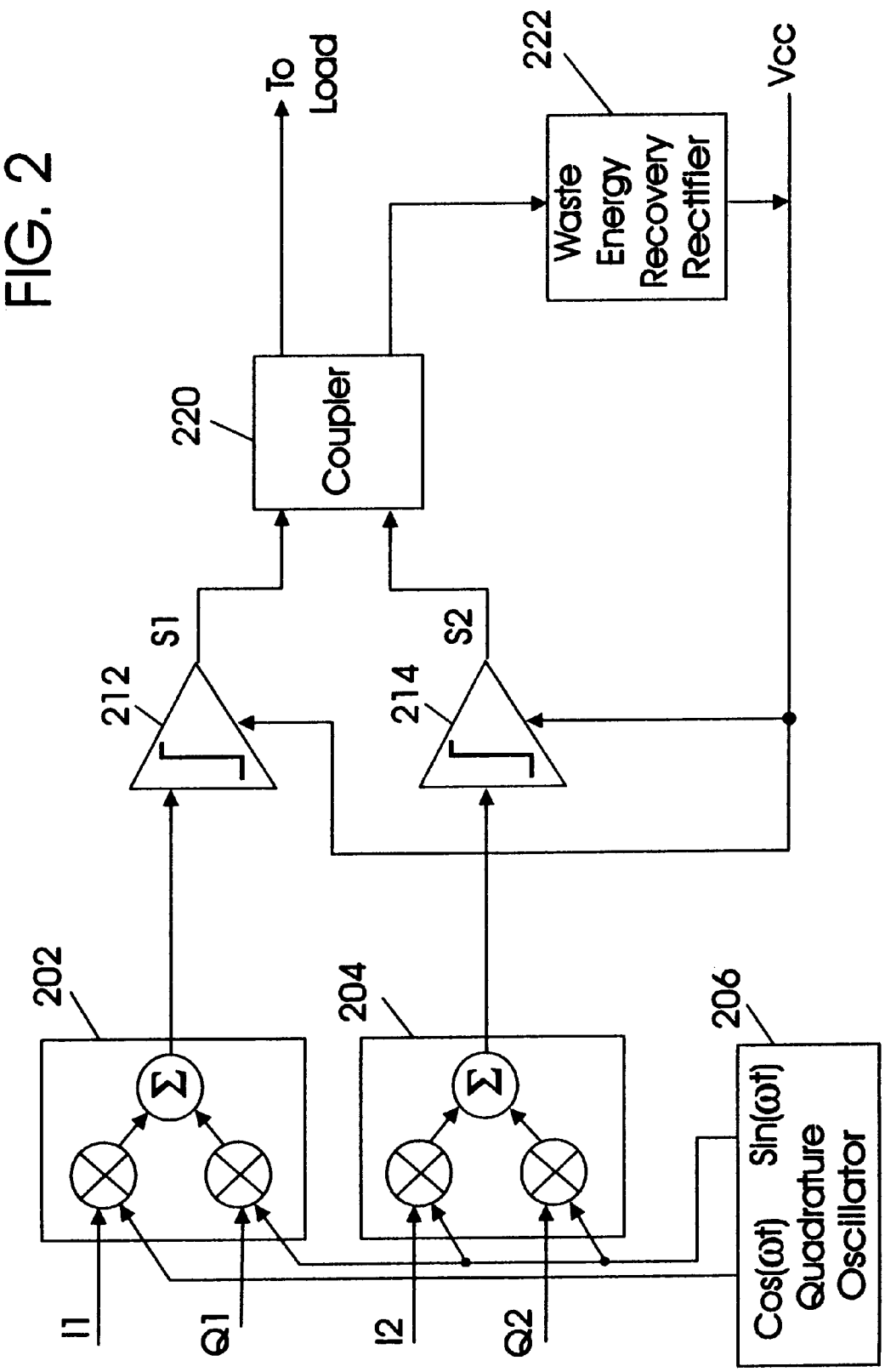
FIG. 2 is a block diagram of a conventional power amplifier using quadrature modulators and a pair of isolated power amplifiers.

In that era, Chireix did not have the benefit of modern digital signal processing technology to accurately generate the two out-phased signals. A modern implementation using two quadrature modulators 202, 204 driven by digitally synthesized vector waveforms I1, Q1, I2, Q2 and a quadrature oscillator 206 is shown in FIG. 2.

The output of the two power amplifiers 212, 214 each being for example, a class-C amplifier of power Pmax/2, can be added using a hybrid or −3 dB directional coupler 220 (coupling factor "k"=0.7071). A hybrid or directional coupler 220 effectively produces a sum and difference signal. Terminating the difference port and the sum port with like impedances gives isolation between the two power amplifiers so that power (voltage or current) from one does not reach the other. The sum signal rises to Pmax when both amplifiers are driven in phase, and falls to zero when they are driven 180 degrees out of phase. In between, the power is $Pmax \cdot cos^2(\alpha)$ where '$\alpha$' is the relative phasing. The difference output is $Pmax \cdot sin^2(\alpha)$ and the sum of the outputs is thus always Pmax.

When the desired output P(t) is less than Pmax, the difference Pmax−P(t) comes out the difference port and is normally lost. The average efficiency in this case may be even worse than that calculated above for class-B, as the battery current does not reduce when the output is less than Pmax. On the other hand, there is a possibility that constant envelope amplifiers can be constructed in practice with higher efficiency (at Pmax) than amplifiers with a linearity requirement, so that in practice an advantage may be obtained. However, even if a class-C efficiency of 100% could be obtained, the arrangement would only give 50% efficiency with a peak-to-mean power ratio of 3 dB, and 25% with a peak-to-mean ratio of 6 dB.

To help the efficiency, applicant proposed in the above-incorporated Dent patents to recover the energy normally dissipated at the difference port of the output coupler. A waste energy recovery rectifier 222 is used to rectify the dissipated energy and feed the DC current back to the battery. It is known that very efficient rectifiers can be made even at microwave frequencies, as research on wireless power transmission using microwaves has demonstrated.

For digital modulation signals, it is known that the number of different I and Q waveforms that are needed over a data bit interval can be limited to two to the power of a small number of bits surrounding the current bit, because data bits further removed from a current data bit have negligible effect. Thus the waveforms I1, Q1, I2 and Q2 may be precomputed for all two to the power N combinations of nearby bits and stored in memory, and recalled when needed. In that way, the need to compute arc-cosines in real time may be avoided.

Figure 3:
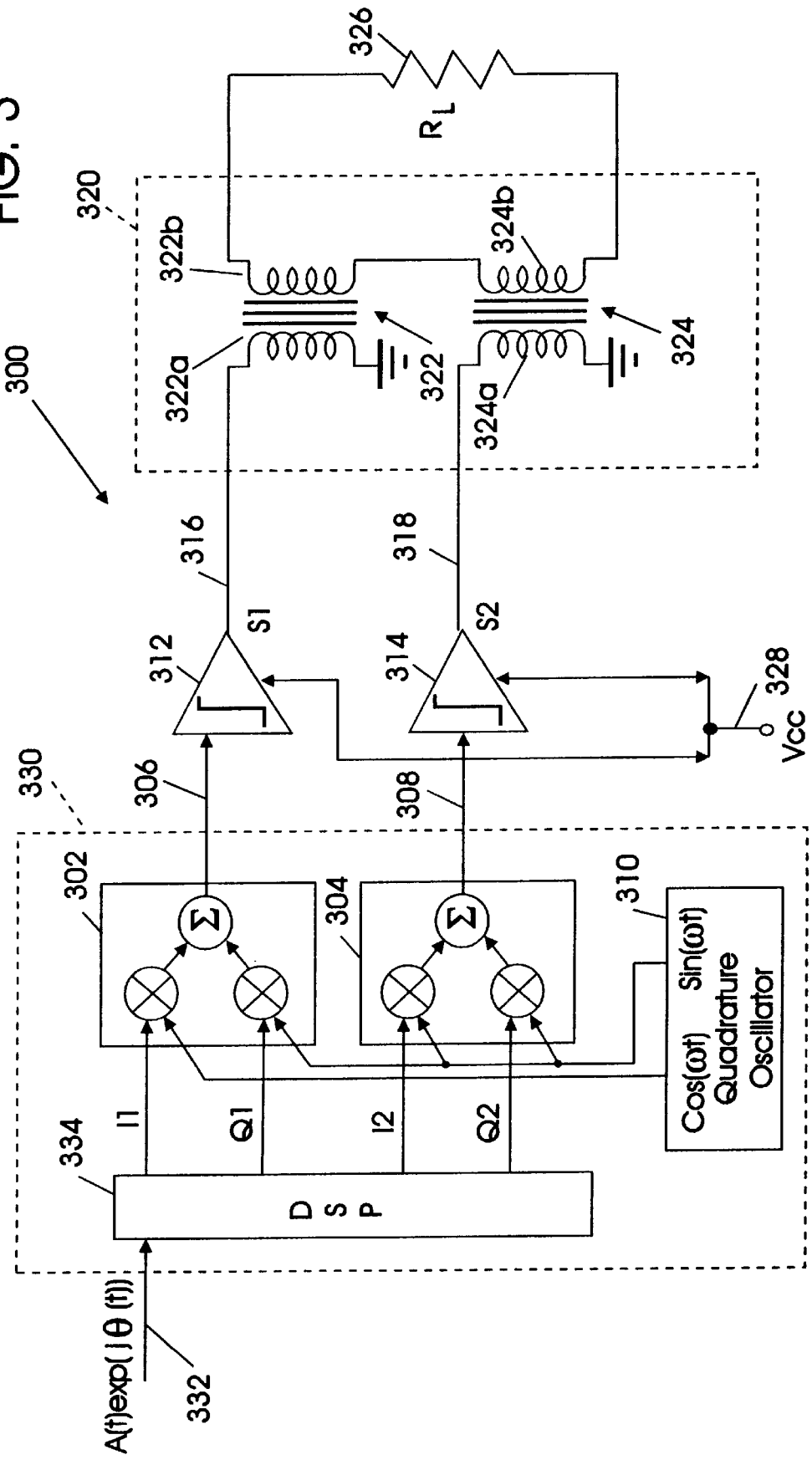
FIG. 3 is a block diagram of a first embodiment of power amplifiers according to the present invention.

Referring now to FIG. 3, a power amplifier 300 according to the present invention is described. Power amplifier 300 amplifies an AC input signal 332 of varying amplitude and varying phase to produce an amplified output signal voltage and an output current in a load impedance $R_L$ 326 using a DC power supply VCC 328. It will be understood that the load impedance 326 may be an antenna and the DC power supply 328 may be a battery.

Still referring to FIG. 3, the power amplifier 300 includes converting means 330 for converting the AC input signal 332 into a first signal 306 having constant amplitude and a first phase angle and into a second signal 308 having constant amplitude and a second phase angle. Converting means 330 may be formed by a digital signal processor (DSP) 334 that generates I1, Q1, I2 and Q2 signals. First and second quadrature modulators 302, 304 respectively, are responsive to a quadrature oscillator 310 and to the in-phase and quadrature signals I1, Q1, I2, Q2 to produce the first signal 306 and second signal 308. The design and operation of converting means 330, and the individual components thereof, are well known to those having skill in the art and need not be described further herein.

Still referring to FIG. 3, a first amplifier 312 amplifies the first signal 306, to produce a first output signal voltage S1 (316) of constant voltage amplitude. As will be described in detail below, the first amplifier 312 preferably includes bilateral amplifier devices that draw current from the DC power supply, but that also supply current to the DC power supply. Accordingly, the connection between first amplifier 312 and DC power supply 328 is shown to be bidirectional.

Still referring to FIG. 3, a second amplifier 314 amplifies the second signal 308 to produce a second output signal voltage of constant voltage amplitude S2 (318). As was described above, the second amplifier 314 also preferably includes bilateral amplifier devices that draw current from the DC power supply and supply current to the DC power supply. Amplifiers 312 and 314 may be class-C power amplifiers, although other classes of power amplifiers may also be used.

Still referring to FIG. 3, a coupler 320 couples the first and second amplifiers 312 and 314 to each other and to the load impedance 326 such that the voltage or current in the first amplifier become linearly related to the voltage or current in the second amplifier. Coupler 320 may be contrasted from a directional coupler that was used in a conventional Chireix circuit. In particular, the coupler 320 does not isolate the first and second amplifiers from one another. Rather, it interactively couples the first and second amplifiers to one another, so that each affects the other's load line.

In FIG. 3, the coupler 320 comprises a first transformer 322 and a second transformer 324. Their respective secondaries 322b and 324b are serially coupled across a load impedance 326. Their respective primaries 322a and 324a are coupled to the outputs 316 and 318 of first and second amplifiers 312 and 314 respectively. Accordingly, the sum of the first and second output signal voltages S1 and S2 produces the amplified output signal voltage across the load impedance 326 and also produces the output current through the load impedance. An amplifier current that is linearly related to the output current flows in the bilateral amplifier devices of both the first and second amplifiers 312 and 314.

The transformers 322 and 324 facilitate the series coupling of outputs that are relative to ground. The series coupling can ensure that the same current, equal to the load current or a scaled value thereof, flows in the output circuits of both amplifiers 312 and 314.

By omitting the output coupler of FIG. 2, which isolated the two amplifiers from each other, the amplifiers are now allowed to affect or interact with each other. In particular, when the two amplifiers are driven out of phase so that output signal S1 equals −S2, the sum of their outputs into load impedance RL will be zero and there will be no load current. Therefore, the current flowing in the amplifier devices will also be zero due to the series connection, which ensures that both amplifier currents and the load current are the same. If no current flows in the amplifier devices, the current consumed from the DC supply voltage Vcc will also be zero. Thus in contrast to the coupled power amplifiers of FIG. 2, which consume a constant amount of power from the supply even when the instantaneous load power is zero, the arrangement of FIG. 3 can reduce its current consumption as the instantaneous output power is reduced.

Figure 4:
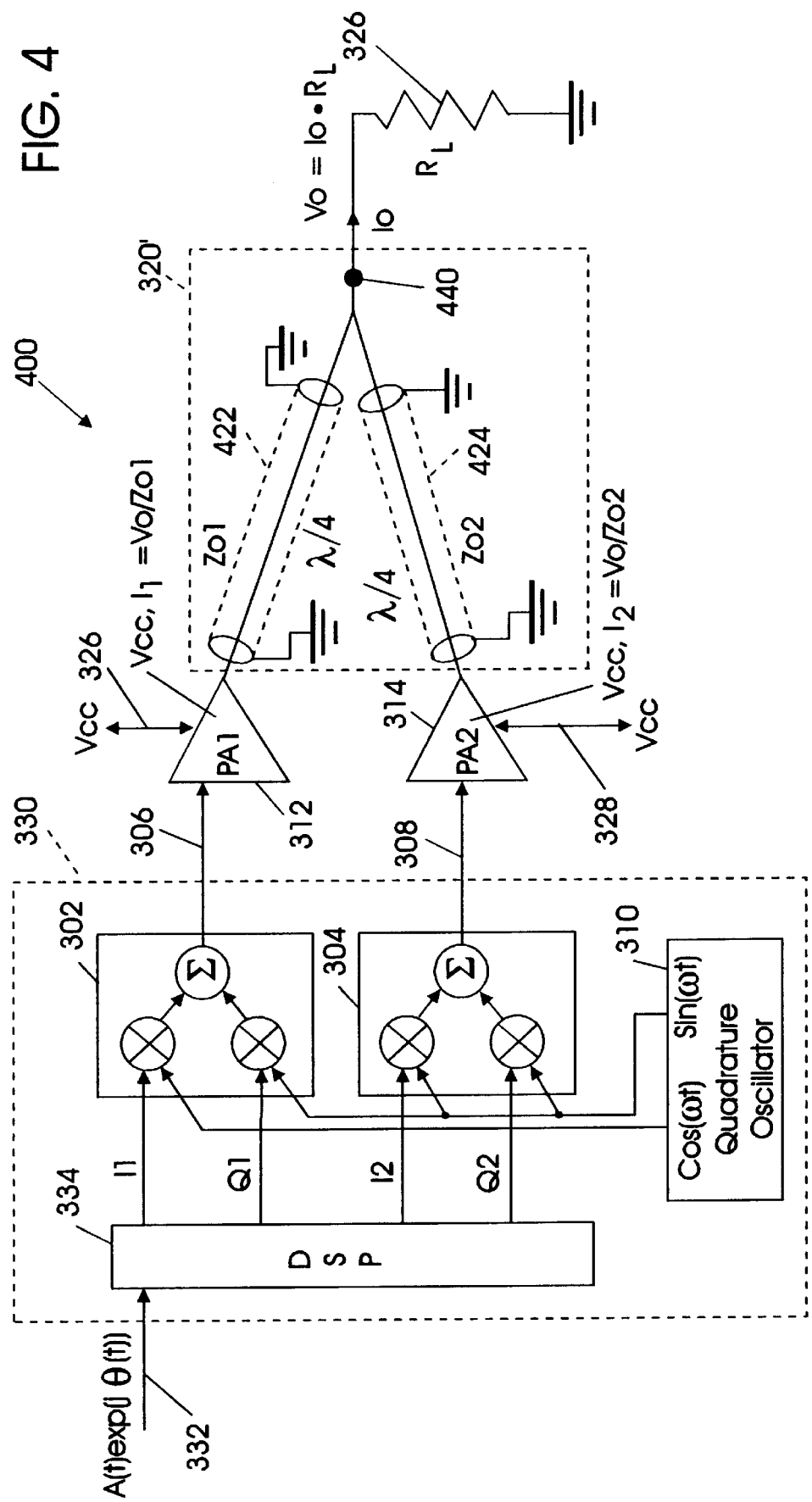
FIG. 4 is a block diagram of a second embodiment of power amplifiers according to the present invention.

Referring now to FIG. 4, a second embodiment of power amplifiers according to the present invention is shown. As shown in FIG. 4, power amplifier 400 is similar to power amplifier 300 of FIG. 3. However, the interactive coupler 320' that couples the first and second amplifiers 312 and 314 to the load impedance 326 is embodied by first and second quarter wavelength transmission lines 422 and 424 respectively. The load impedance includes an input node 440, and the first and second quarter wavelength transmission lines 422 and 424 are preferably coupled to the input node 440.

As illustrated in FIG. 4, series connection at microwave frequencies may be more practically achieved by parallel connection a quarter wave distant, using the two quarter wave lines 422 and 424. When the outputs of the two quarter wave lines are paralleled, the output voltages are forced to be the same (Vo) at the input node 440. This forces the currents to be the same quarter-wave away at the power amplifiers 312 and 314, if the lines are of equal impedance, creating the same conditions as in the series connection of FIG. 3. If the transmission lines are of different impedance 201, 202, the power amplifier output currents I1 and I2 are forced to be scaled in the inverse ratio of the impedances.

The power amplifiers ideally each generate an output swing of Vcc at their ends of their quarter wave lines. Since the voltages are the same at that end, the currents at the other end one quarter wave away must be equal with equal lines. With unequal line impedances, the currents will be respectively Vcc/Zo1 and Vcc/Zo2 at the junction of the lines. The total output current is thus Io=Vcc (1/Zo1+1/Zo2) or 2 Vcc/Zo for equal lines.

If the power amplifiers generate relatively phased currents Vcc·EXP(jα) and Vcc·EXP(-jα), then the total output current is:

$$Io = VCC\left(\frac{EXP(j\alpha)}{Zo} + \frac{EXP(-j\alpha)}{Zo}\right)$$
$$= 2Vcc \cdot Cos(\alpha)/Zo,$$

assuming equal impedance Zo lines.
The voltage Vo is thus given by:

$$Io \cdot R_L = \frac{2VCC \cdot R_L Cos(\alpha)}{Zo}$$

This in turn forces the power amplifier currents to be:

$$\frac{2Vcc \cdot R_L Cos(\alpha)}{Zo^2}$$

showing that the peak current in each power amplifier has reduced by Cos (α), which it did not do in the case of hybrid coupling. When α=90 degrees, the power amplifiers are antiphased, the output signals Vo, Io are zero, but so is the power amplifier current even though they are still driven to full Vcc output swing. It is as if the load impedance had been increased to infinity. Thus, by modulating α (in the DSP code), the effective load impedance seen by the power amplifiers is also modulated so that they generate only the instantaneously desired output power.

To obtain maximum efficiency, it is desirable to avoid harmonic currents flowing in the power amplifier output circuits. This may be obtained using a series resonant circuit in series with the power amplifier output terminal to present a low impedance to the fundamental and a high impedance to harmonics. However, a single shunt resonant circuit 550 may instead be connected one quarter wave away at the node of the two quarter wave lines, as shown in amplifier 500 of FIG. 5. The shunt resonator forces the voltage waveform to be sinusoidal at the junction of the lines (node 440), and therefore one quarter wave away the current at the power amplifier devices is forced to be sinusoidal.

Figure 6:
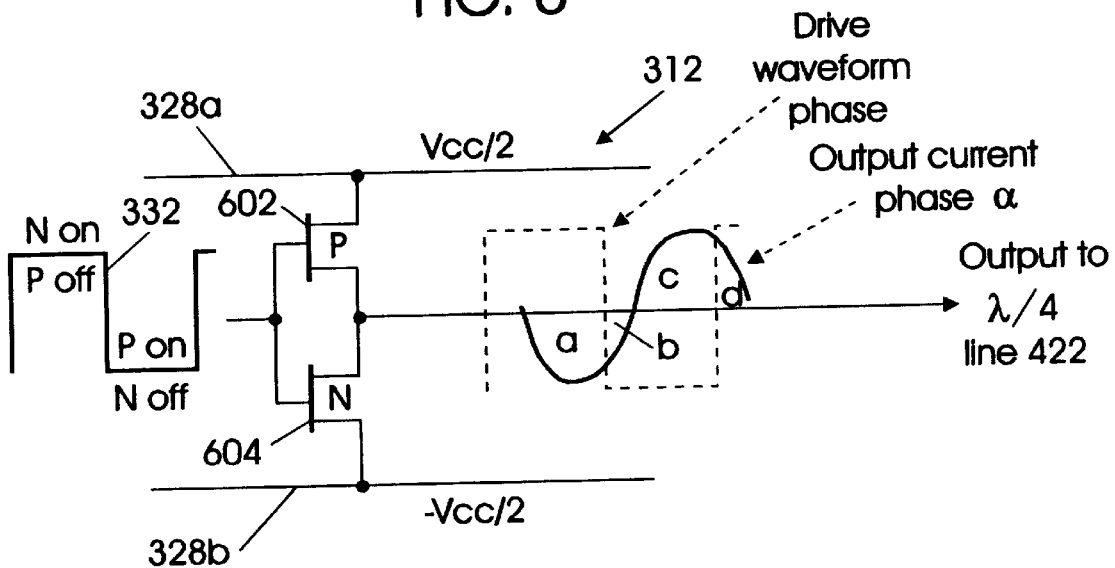
FIG. 6 is a circuit diagram of current and voltage relations in a power amplifier that uses bilateral devices.

As described above, the first and second amplifiers 312 and 314 respectively preferably include bilateral amplifier devices that draw current from the DC power supply 326 and supply current to the DC power supply. Accordingly, during part of the signal cycle of the AC input signal 332, current flows from the first and second amplifiers to the DC power supply to return energy to the DC power supply. FIG. 6 illustrates a power amplifier including bilateral amplifier devices according to the present invention.

As shown in FIG. 6, power amplifier 312 includes a P-type field effect transistor 602 and an N-type field effect transistor 604 that are respectively coupled between positive and negative power supplies 328a and 328b respectively. Input signal 332 is coupled to the P-type field effect transistor 602 and the N-type field effect transistor 604. These field effect transistors produce an output signal that is provided to the quarter wavelength line 422. Similar considerations apply to second amplifier 314.

When α is between 0 and 90 degrees, the sinusoidal current in the power amplifier devices is not in phase with the switching of the devices on and off, as illustrated in FIG. 6. As also shown in FIG. 6, the mean current from the power supplies is reduced by a further factor of cos (α) relative to the peak current Ipk. Since Ipk also reduces with cos (α), the net supply current reduces as $cos^2(\alpha)$, which is the same factor by which the output power is reduced by modulating α. The supply power and load power both therefore track, maintaining the same theoretical efficiency when backed off as when not. This relies on the use of bilateral power amplifier devices which can pass current in the reverse direction during part of the input signal cycle, returning energy to the battery.

That the theoretical efficiency using ideal bilateral devices is 100% may be understood in the context of a single ended push-pull output stage, as shown in FIG. 6. In region "a" from 0 to (π-α), the current flows from -Vcc/2 to the load, while the N-type device is on, pulling down. This is delivering energy from -Vcc/2 source 328b to the load. In region "b", current is still negative, but the P-type device is on. That means current and energy are flowing back towards the +Vcc/2 source 328a. In region "c", current is flowing from the Vcc/2 328a source to the load while the P-type device is on, and in region "d", current is still negative when the N-type device comes on, sending current and energy back to the -Vcc/2 source 328b. The mean currents are thus:

$$\frac{Ipk}{2\pi}\left[\int_0^{\pi-\alpha} \sin(\theta)\delta\theta - \int_0^{\alpha} \sin(\theta)\delta\theta\right] = I_{pk}\cos(\alpha)/\pi$$

from each of the -Vcc/2 and +Vcc/2 supplies, that is reduced by the factor cos (α) compared to an in-phase current.

In FIG. 6, the mean supply currents from the split supplies -Vcc/2 and +Vcc/2 are computed to be Ipk/π when α=0. The total power from both supplies is therefore:

$$Ipk \cdot Vcc/\pi. \qquad (1)$$

Figure 5:
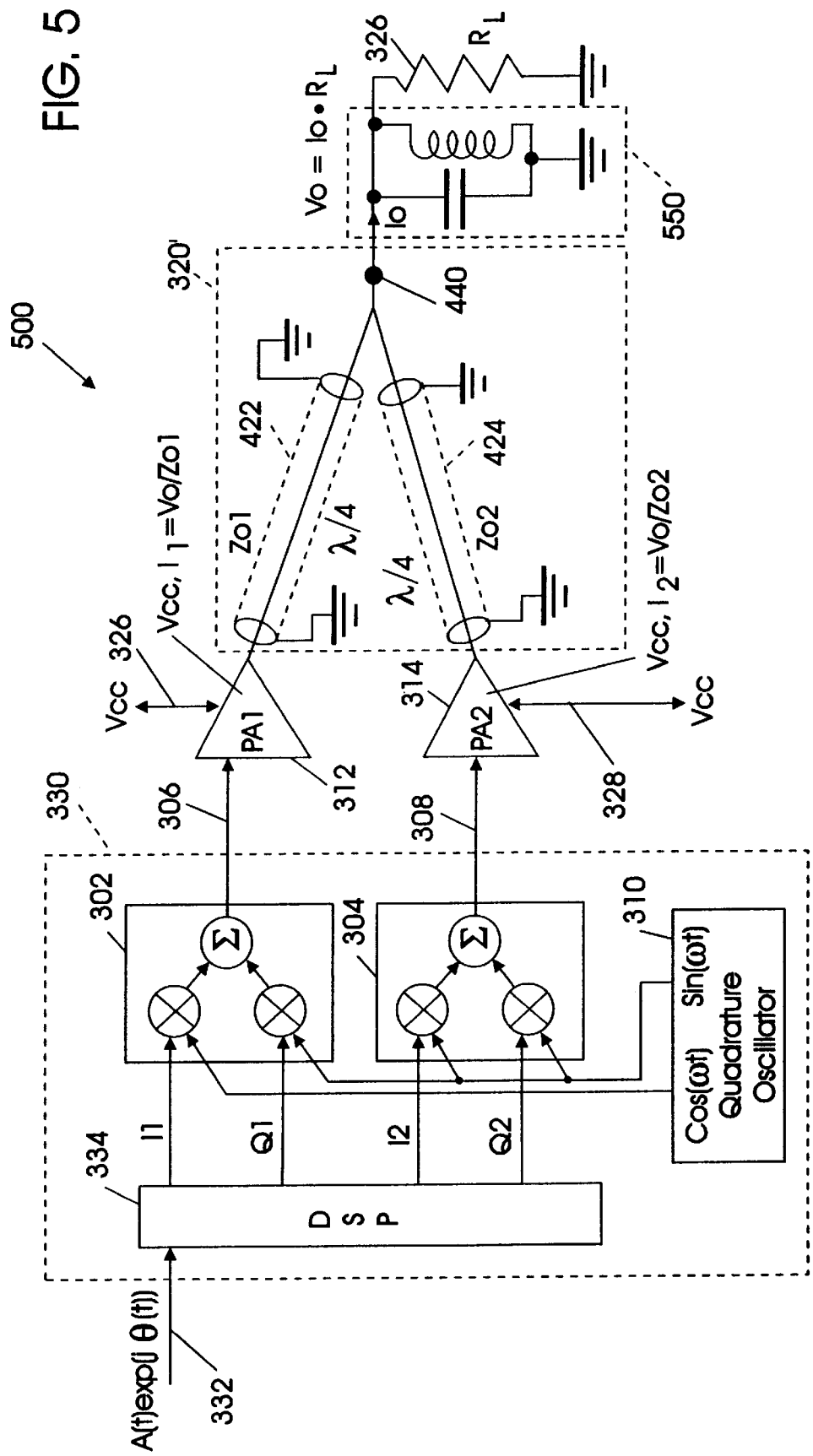
FIG. 5 is a block diagram of a third embodiment of power amplifiers according to the present invention.

The square-wave voltage swing at the single-ended power amplifier output is -Vcc/2 to I-Vcc/2 i.e. Vcc/2 peak, so the current at the end of a quarter wave line of impedance Zo must be a square wave of peak current +/- Vcc/2Zo. The fundamental component of a square wave is 4/π times the peak, so the fundamental current driving the resonator of FIG. 5 is:

$$\frac{2Vcc}{\pi \cdot Zo} \text{peak} \quad (2)$$

The current induces a peak load voltage of:

$$\frac{2Vcc \cdot R_L}{\pi \cdot Zo} \quad (3)$$

The load power is thus ½×peak current×peak voltage:

$$= \frac{2Vcc^2 \cdot R_L}{(\pi \cdot Zo)^2} \quad (4)$$

Equation (3) gives the sinusoidal voltage swing on the resonator at the end of the quarter wave line. Thus, the current at the power amplifier device end of the line is this divided by Zo, i.e.:

$$Ipk = \frac{2Vcc \cdot R_L}{\pi \cdot Zo^2} \quad (5)$$

Substituting for Ipk from equation (5) into equation (1) gives the total DC input power as:

$$= \frac{2Vcc^2 \cdot R_L}{(\pi \cdot Zo)^2} \quad (6)$$

which is the same as equation (4), showing that the efficiency is 100%.

Figure 7:
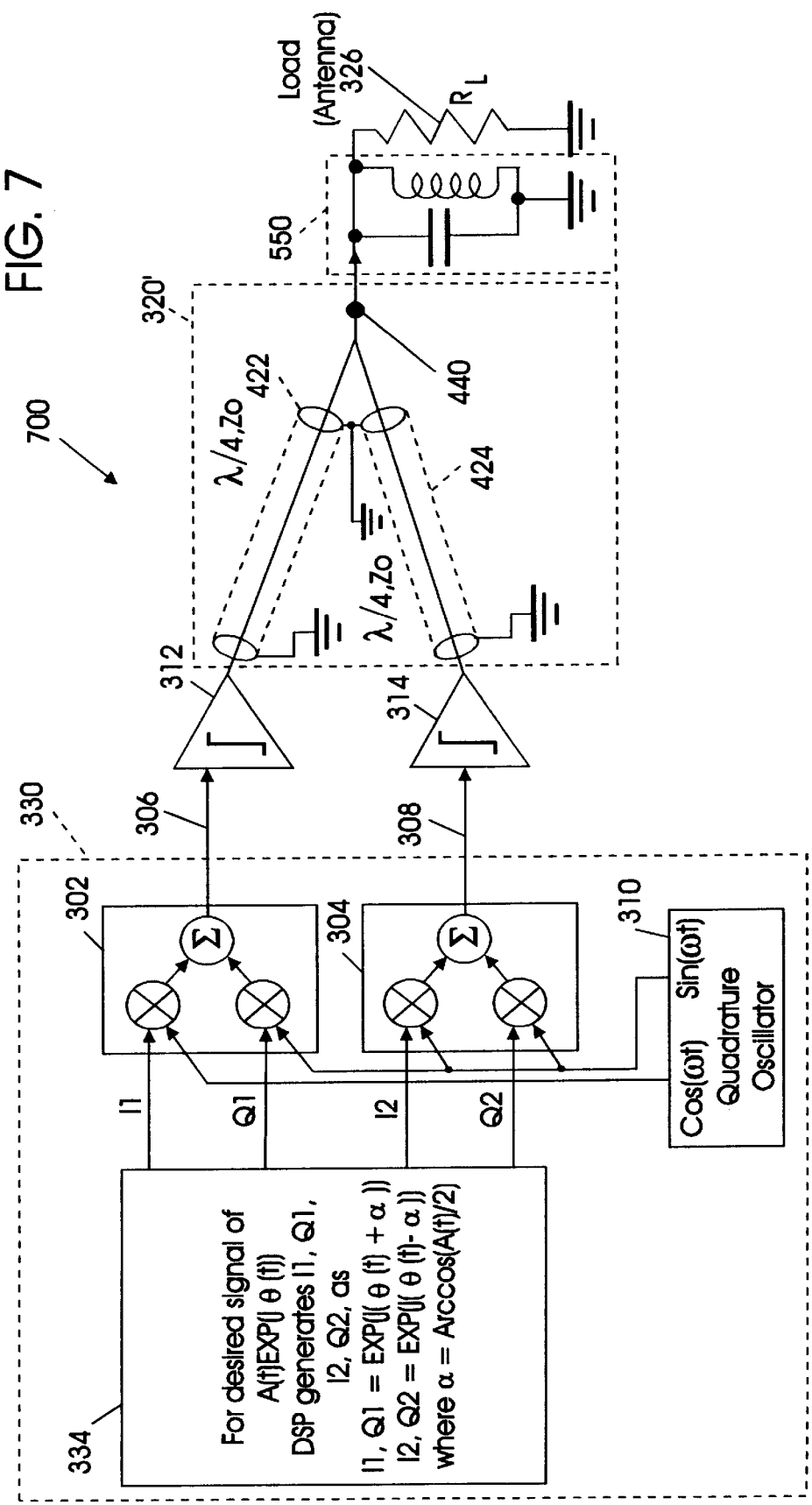
FIG. 7 is a block diagram of a fourth embodiment of power amplifiers according to the present invention.

It is well known that a switch-mode inverter with lossless filtering to convert a square-wave to a sine-wave output gives theoretical 100% efficiency. However, in the arrangement of FIGS. 3 to 6, which is encapsulated in the transmitter of FIG. 7, the efficiency is maintained even for signals of varying amplitude, or when the transmitter is backed off to less than full output. In FIG. 7, amplifier 700 can use switch-mode (class-D) power amplifiers. The load 326 is an antenna. Thus, the present invention, which has no theoretical limitations to efficiency, is a better starting point than prior art power amplifiers, the theoretical efficiency of which is already less than 100% even with ideal devices.

Figure 8:
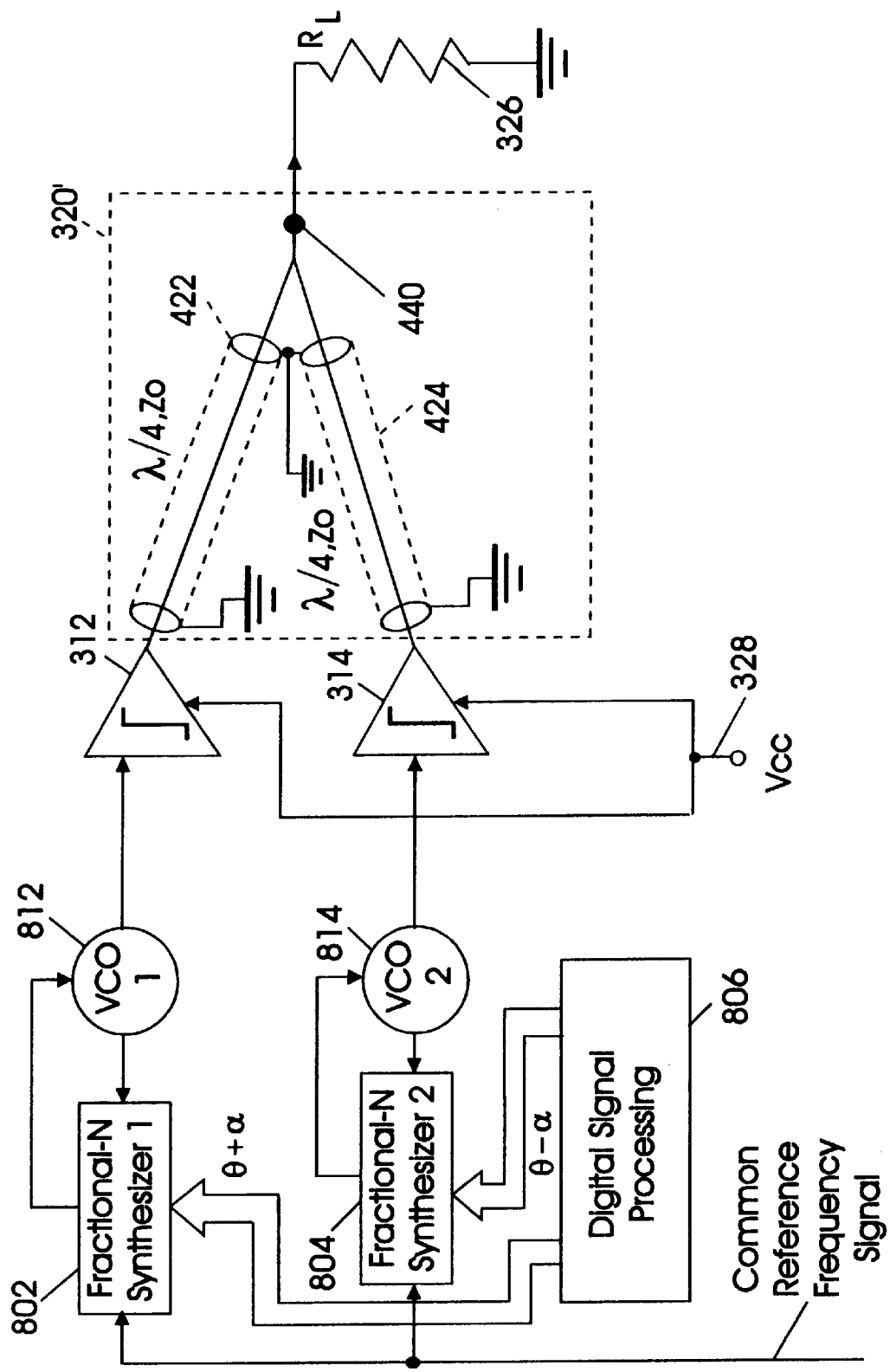
FIG. 8 is a block diagram of a fifth embodiment of power amplifiers according to the present invention.

The present invention uses means, such as a digital signal processor (DSP) 334, to convert a complex modulation signal having a varying amplitude and a varying phase into two modulation signals having constant amplitude and differently varying phases. It then uses means to produce two signals modulated by respective phase modulation signals. One means has been illustrated in FIG. 2, namely the use of two quadrature modulators 302, 304 driven respectively by the cosine and sine of their respective phase modulation signals. Another technique is shown in FIG. 8 wherein two frequency synthesizers, each modulatable in phase, such as modulatable fractional-N synthesizers 802 and 804 are used. A modulatable fractional-N synthesizer comprises an accumulator whose value determines the phase of an oscillator 812, 814 controlled by the synthesizer. Normally in a fractional-N synthesizer, the accumulator augments continuously (with wraparound) by the repeated addition of a slope value, which provides a frequency offset. To change the phase, the accumulator may be additionally augmented by adding once only a value equal to the change of phase desired. This arrangement is shown in FIG. 8.

Using two separate fractional-N synthesizers 802, 804, the cumulative nature of the delta-phase values added may get out of step. In practice therefore, the need to maintain synchronism suggests that the two synthesizers should be combined into a single chip. Moreover, the type of synthesizer called a "reciprocal fractional-N" disclosed by applicant in U.S. patent application Ser. No. 08/902,836, filed Jul. 30, 1997, assigned to the assignee of the present application, the disclosure of which is hereby incorporated herein by reference, may be advantageous, as it modulates the reference divider controlled by a fixed reference frequency, which is then easier to synchronize when two modulated synthesizers are required.

Another directly phase-modulatable synthesizer technique is the Direct Digital Synthesizer or DDS, in which an accumulator computes the value of (($\omega t + \phi$)) continuously and converts the most significant part to a sine wave using a sine look-up table. Any other conventional method of producing phase modulated signals can also be used with the present invention.

Accordingly, a transmit power amplifier for linearly amplifying signals of varying amplitude and phase comprises a signal generator for generating a first amplifier drive signal of constant amplitude and first phase angle and a second amplifier drive signal of constant amplitude and second phase angle such that the combined signals have the desired instantaneous amplitude and phase angle of a signal to be transmitted. The first drive signal is amplified by a first power amplifier using first active amplifier devices and the second drive signal is amplified by a second power amplifier using second active amplifier devices, the first and second amplifier devices preferably being driven to saturation.

The outputs of the first and second power amplifiers are connected using two quarter wave lines each connected to respective active devices at one end and connected to a common junction at their other end. Alternatively, transformers may be used.

A shunt resonant circuit at the common junction can constrain the voltage at the junction to be sinusoidal and proportional to the cosine of half the difference between the first and second phase angle. The shunt circuit can thereby constrain the peak current in the amplifier devices to be sinusoidal and proportional to the same cosine.

The sinusoidal currents in the devices are also out of phase with their respective drive wave forms by plus and minus half the difference between said first and second waveform such that power is taken from a DC supply source during part of the cycle and returned by reverse conduction through an amplifier device during another part of the cycle. The mean current consumed from the DC supply source can thereby be reduced by a further factor equal to the cosine. The net power consumed from the DC source therefore can reduce in proportion to the square of the cosine and in the same ratio as sinusoidal power delivered to the load, thus maintaining the same efficiency at all reduced instantaneous amplitudes as at peak output amplitude, within the limits of practical devices.

The theoretical efficiency of the present linear amplifier using ideal devices is 100% even when backed-off to reduced output levels and thus can be a better starting point for obtaining high efficiency than a prior art amplifier. For example, a class-B type has a theoretical efficiency using ideal devices of only 78.5% at full output.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A power amplifier that amplifies an AC input signal of varying amplitude and varying phase to produce an amplified output signal voltage and an output current in a load impedance using a DC power supply, comprising:

means for converting the AC input signal of varying amplitude and varying phase into a first signal having constant amplitude and a first varying phase angle and into a second signal having constant amplitude and a second varying phase angle such that the difference between the first and second varying phase angles varies as a function of the AC input signal of varying amplitude and varying phase angle;

first means for amplifying the first signal having constant amplitude and a first varying phase angle to produce a first output signal voltage of constant voltage amplitude, the first amplifying means including bilateral amplifier devices that draw current from the DC power supply and supply current to the DC power supply;

second means for amplifying the second signal having constant amplitude and a second varying phase angle to produce a second output signal voltage of constant voltage amplitude, the second amplifying means including bilateral amplifier devices that draw current from the DC power supply and supply current to the DC power supply; and means for coupling the first and second output signal voltages to the load impedance, such that a voltage proportional to the sum of the first and second output signal voltages of constant amplitude produces the amplified output signal voltage across the load impedance and produces the output current through the load impedance, and such that an amplifier current that is linearly related to the output current flows in the bilateral amplifier devices of both the first and second amplifying means.

2. A power amplifier according to claim 1 wherein during part of the signal cycle of the AC input signal, current flows from the first and second amplifying means to the DC power supply, to return energy to the DC power supply.

3. A power amplifier according to claim 1 wherein the converting means comprises a quadrature oscillator and first and second quadrature modulators that are coupled to the quadrature oscillator to produce the first and second signals respectively.

4. A power amplifier according to claim 3 wherein the converting means further comprises a quadrature signal generator that is coupled to the first and second quadrature modulators and that is responsive to the AC input signal to generate in-phase and quadrature signals.

5. A power amplifier according to claim 4 wherein the quadrature signal generator is a digital signal processor.

6. A power amplifier according to claim 1 wherein the converting means comprises a data processor.

7. A power amplifier according to claim 1 wherein the converting means comprises a digital frequency synthesizing circuit including phase modulation capability.

8. A power amplifier according to claim 7 wherein the digital frequency synthesizing circuit comprises a direct digital frequency synthesizer.

9. A power amplifier according to claim 1 wherein the coupling means comprises at least one transformer.

10. A power amplifier according to claim 9 wherein the at least one transformer comprises a first transformer including a first primary and a first secondary, and a second transformer including a second primary and a second secondary, the first output signal voltage being coupled to the first primary and the second output signal voltage being coupled to the second primary, the first and second secondaries being serially connected across the load impedance.

11. A method for amplifying an AC input signal of varying amplitude and varying phase using a DC power supply, the amplifying method comprising the steps of:

converting the AC input signal of varying amplitude and varying phase into a first signal having constant amplitude and a first varying phase angle and into a second signal having constant amplitude and a second varying phase angle such that the difference between the first and second varying phase angles varies as a function of the AC input signal of varying amplitude and varying phase angle;

amplifying the first signal having constant amplitude and a first varying phase angle in a first amplifier;

amplifying the second signal having constant amplitude and varying phase angle in a second amplifier; and coupling the first and second amplifiers to one another and to a load impedance, such that respective voltages or currents in the first amplifier become linearly related to respective voltages or currents in the second amplifier.

12. A method according to claim 11:

wherein the step of amplifying the first signal further comprises the step of returning energy from the first amplifier to the DC power supply during part of the signal cycle of the AC input signal; and wherein the step of amplifying the second signal further comprises the step of returning energy from the second amplifier to the DC power supply during part of the signal cycle of the AC input signal.

13. A method according to claim 11 wherein the coupling step comprises the step of coupling the first and second amplifiers to the load impedance using at least one transformer.

14. A method according to claim 11 wherein the coupling step comprises the step of coupling the first and second amplifiers to the load impedance using respective first and second quarter wave transmission lines.

15. An apparatus that amplifies an AC input signal of varying amplitude and varying phase using a DC power supply, comprising:

a converter that converts the AC input signal of varying amplitude and varying phase into a first signal having constant amplitude and a first varying phase angle and into a second signal having constant amplitude and a second varying phase angle such that the difference between the first and second varying phase angles varies as a function of the AC input signal of varying amplitude and varying phase angle;

a first amplifier that amplifies the first signal having constant amplitude and a first varying phase angle;

a second amplifier that amplifies the second signal having constant amplitude and a second varying phase angle; and a coupler that couples the first and second amplifiers to one another and to a load impedance, such that respective voltages or currents in the first amplifier become linearly related to respective voltages or currents in the second amplifier.

16. An apparatus according to claim 15:
wherein the first and second amplifiers are first and second bilateral amplifiers such that current flows from the first and second amplifiers to the DC power supply during part of the signal cycle of the AC input signal, to thereby return energy to the DC power supply.

17. An apparatus according to claim 15 wherein the coupler comprises at least one transformer that serially couples the first and second amplifiers to the load impedance.

18. An apparatus according to claim 15 wherein the coupler comprises first and second quarter wave transmission lines that couple the respective first and second amplifiers to the load impedance.

* * * * *